US008692613B2

(12) United States Patent
Ji et al.

(10) Patent No.: US 8,692,613 B2
(45) Date of Patent: Apr. 8, 2014

(54) MODIFIED DYNAMIC LOAD SCALING (MDLS) TECHNIQUE FOR IMPLEMENTING HIGH EFFICIENCY LOW POWER MODE OPERATION

(75) Inventors: Ming Ji, Melrose, MA (US); Douglas Teeter, Lexington, MA (US); Bhavin Shah, Cambridge, MA (US)

(73) Assignee: RF Micro Devices, Inc., Greensboro, NC (US)

( * ) Notice: Subject to any disclaimer, the term of this patent is extended or adjusted under 35 U.S.C. 154(b) by 67 days.

(21) Appl. No.: 13/400,934

(22) Filed: Feb. 21, 2012

(65) Prior Publication Data
US 2012/0212292 A1    Aug. 23, 2012

Related U.S. Application Data

(60) Provisional application No. 61/445,213, filed on Feb. 22, 2011.

(51) Int. Cl.
*H03F 1/14* (2006.01)
*H03F 1/30* (2006.01)

(52) U.S. Cl.
CPC .................................... *H03F 1/305* (2013.01)
USPC ........................................ 330/51; 330/124 R

(58) Field of Classification Search
USPC ............................................. 330/51, 124 R
See application file for complete search history.

(56) References Cited

U.S. PATENT DOCUMENTS

| 8,130,043 | B2 * | 3/2012 | Arell .............................. 330/302 |
| 8,149,050 | B2 * | 4/2012 | Cabanillas ....................... 330/51 |
| 2012/0154054 | A1 * | 6/2012 | Kaczman et al. ............. 330/295 |

OTHER PUBLICATIONS

Hau, G. et al., "Multi-Mode WCDMA Power Amplifier Module with Improved Low-Power Efficiency using Stage-Bypass", 2010 Radio Frequency Integrated Circuits (RFIC) Symposium, Anaheim, CA, May 23-25, 2010, pp. 163-166.
Teeter, D. A. et al., "Average Current Reduction in (W)CDMA Power Amplifiers", 2006 RFIC Symposium Digest, Jun. 11-13, 2006, pp. 429-431.
Fowler, T. et al., "Efficiency Improvement Techniques at Low Power Levels for Linear CDMA and WCDMA Power Amplifiers," IEEE Radio Frequency Integrated Circuits Symposium Digest, Jun. 2002, pp. 41-44.
Kim, J. et al., "An InGaP-GaAs HBT MMIC Smart Power Amplifier for W-CDMA Mobile Handsets," IEEE Journal of Solid State Circuits, vol. 38, No. 6, Jun. 2003, pp. 905-910.
Park, H. et al., "Demonstration of on-chip Appended Power Amplifier for Improved Efficiency at Lower Power Region," 2003 MTT-S International Microwave Symposium Digest, vol. 2, Jun. 8-13, 2003, pp. 691-694.

(Continued)

*Primary Examiner* — Robert Pascal
*Assistant Examiner* — Khiem Nguyen
(74) *Attorney, Agent, or Firm* — Withrow & Terranova, P.L.L.C.

(57) ABSTRACT

A power amplification circuit having three modes of operation and a single switch is disclosed. Only one switch is used to control three different load impedance levels, one load impedance level for each mode of operation. The remaining "switching" results from selectively biasing each power amplification path by turning ON or OFF amplifiers. A series L-C and a switch are used to control the load impedance. Additional modes of operation may also be created without requiring any additional switch. Further, multiple modes of operation may be implemented using no switches.

23 Claims, 13 Drawing Sheets

BLOCK DIAGRAM FOR MDLS ARCHITECTURE
FOR 3 STATE POWER AMPLIFIER

(56) References Cited

OTHER PUBLICATIONS

Hau, G. et al., "A 20mA Quiescent Current 40% PAE WCDMA HBT Power Amplifier Module with Reduced Current Consumption Under Backoff Power Operation," IEEE Radio Frequency Integrated Circuits Symposium, Jun. 12-14, 2005, pp. 243-246.

Nam, J. et al., "A Handset Power Amplifier with High Efficiency at Low Level Using Load-Modulation Technique," IEEE Transactions on Microwave Theory and Techniques, vol. 53, No. 8, Aug. 2005, pp. 2369-2644.

Kim, S. et al., "CDMA Handset Power Amplifier with a Switched Output Matching Circuit for Low/High Power Mode Operations," IEEE MTT-S International Microwave Symposium Digest, Jun. 6-11, 2004, pp. 1523-1526.

Staudinger, J., "Applying Switch Gain Concepts to Improve Efficiency and Linearity for Mobile CDMA Power Amplification," Microwave Journal, Sep. 2000, vol. 43, No. 9, 9 pages.

Jeon, Y. J. et al., "A Highly Efficient CDMA Power Amplifier Based on Parallel Amplification Architecture," IEEE Microwave and Wireless Component Letters, Sep. 2004, pp. 401-403.

\* cited by examiner

BLOCK DIAGRAM FOR MDLS ARCHITECTURE FOR 3 STATE POWER AMPLIFIER

HIGH POWER MODE

MEDIUM POWER MODE

LOW POWER MODE

EXTENDED mDLS - (n+1 MODE POWER AMPLIFIER)

SIMULATED PAE VERSUS MDLS INDUCTOR (Lchain1)
QUALITY FACTOR (Q)

GAIN OF THE MDLS AMPLIFIER AT 1.88 GHz,
Vcc=3.4 V USING IS95 CDMA MODULATION

ACP OF THE MDLS AMPLIFIER AT 1.88 GHz,
Vcc=3.4 V USING IS95 CDMA MODULATION

PAE OF THE MDLS AMPLIFIER AT 1.88 GHz,
Vcc=3.4 V USING IS95 CDMA MODULATION

LPM EFFICIENCY VERSUS LOAD LINE AT
8 dBm OUTPUT POWER WITH Vcc=3.4 V

MAXIMUM LINEAR OUTPUT POWER AND MINIMUM NECESSARY
$I_{CQ}$ FOR -48 dBc IS95 ACPR AS A FUNCTION OF LPM LOADLINE
WITH Vcc=3.4V.

RELATIVE DIE AREA

MODIFIED DYNAMIC LOAD SCALING (MDLS) TECHNIQUE FOR IMPLEMENTING HIGH EFFICIENCY LOW POWER MODE OPERATION

RELATED APPLICATIONS

This application claims the benefit of U.S. Provisional Patent Application No. 61/445,213 filed Feb. 22, 2011, the disclosure of which is incorporated herein by reference in its entirety.

FIELD OF THE DISCLOSURE

The embodiments described herein relate to the field of power amplifiers, and particularly to a multi-mode (multi-state) power amplifier using a single output switch to control three or more different output impedance levels, and thus to control three or more power outputs.

BACKGROUND

Conventionally, a three mode linear power amplifier requires multiple output switches to realize three modes. Multiple switches require substantial space (die area), and this is a serious problem. Using a single switch would use about 40% less die area, and will have additional advantages over conventional systems.

Switch(es) are used to change between conductive and non-conductive states. Each switch needs proper sizing to reduce on-state loss, proper logic control and peripheral matching circuits. Reducing the number of switches thus reduces die area.

SUMMARY

The present disclosure relates to the realization of a three mode linear power amplifier (PA) with three distinct load impedances for High, Medium, and Low power modes utilizing a single switch on the output. This reduces the average current consumption of the PA and increases handset talk time. Only one switch is needed to control three different load impedance levels. The remaining "switching" results from selectively biasing each PA chain (or path) by turning ON or OFF amplifiers. A series L-C and an FET switch are used to control the load impedance.

In low power mode, the equivalent shunt L is large (relatively) and the effective series capacitance is small (relatively), resulting in a high impedance load. In the medium power mode, the equivalent shunt L is medium and the remaining inductance is connected in series with the chain capacitor, increasing the effective series capacitance and hence lowering the load impedance to a medium impedance load. In the high power mode, the switch is OFF and the load impedance is small.

This invention allows the implementation of a three mode PA in roughly 40% less die area than in the prior art, because only one switch is used. The benefits of this invention include: three impedance levels using a single output switch, simpler logic than a conventional multiple switch three mode PA, low average current, and high power added efficiency (PAE). Additionally, a four (or more) mode PA may be similarly implemented using a single switch. Further, it is possible to implement an embodiment of this invention using no switches.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure. The values of various inductors, capacitors, etc. are for illustrative purposes only.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims. The term "connected" is defined broadly, and does not require a direct connection. For example a first element connected to a first node permits the existence of another element (such as a resistor) located electrically between the first element and the first node.

Figure 1:
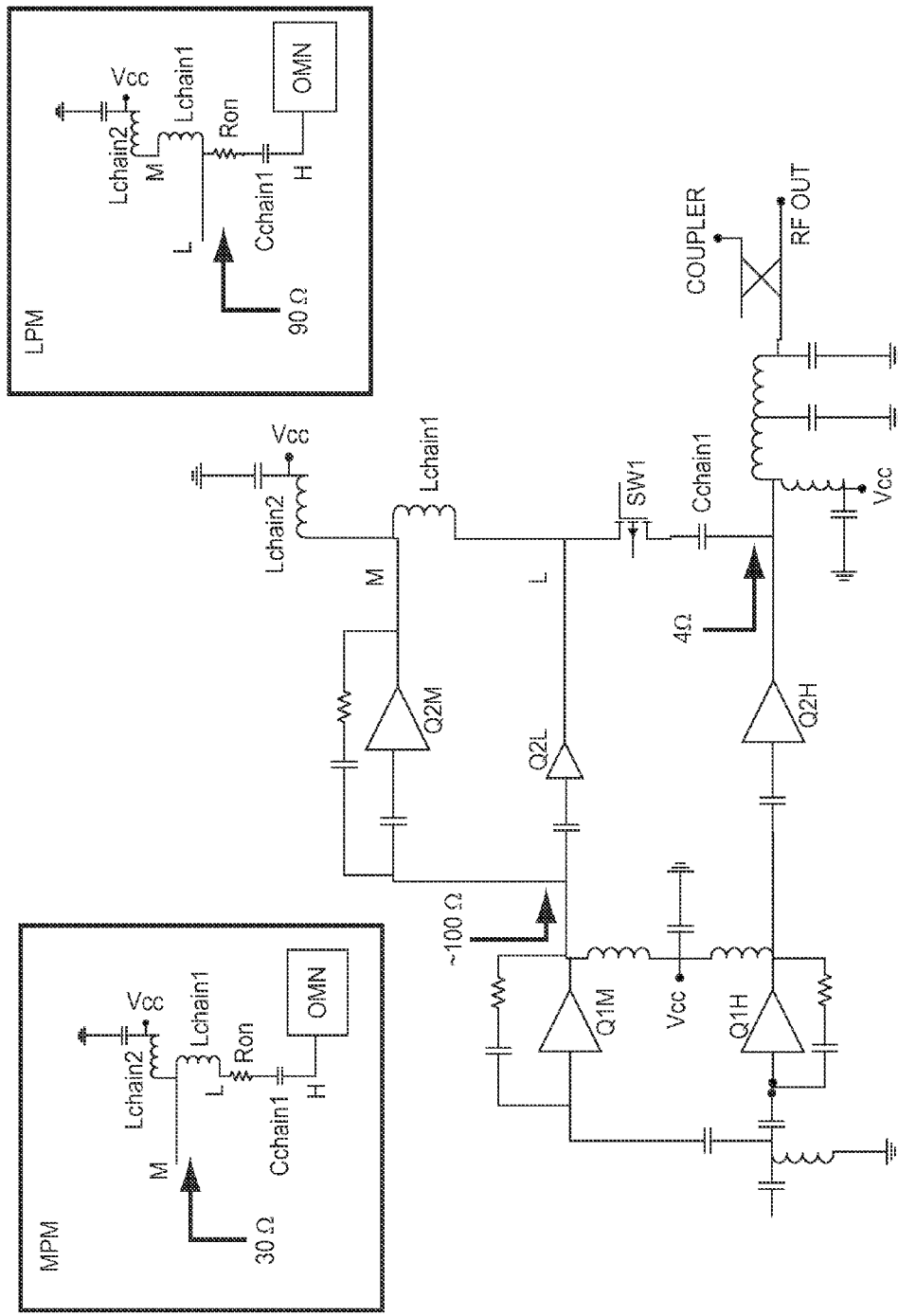
FIG. 1 illustrates an exemplary amplifier architecture for a three mode amplifier with a single output switch.

FIG. 1 depicts an exemplary MDLS power amplifier architecture. There are three modes of operation: high power mode (HPM), medium power mode (MPM), and low power mode (LPM). Table 1, below, illustrates the preferred state of amplifiers (Q1H, Q2H, Q1M, Q2M, and Q2L) and the switch (SW1) for each mode of operation.

TABLE 1

State of Amplifiers and the Switch for Each Mode

| ELEMENTS | HPM | MPM | LPM |
|---|---|---|---|
| Q1H | ON | OFF | OFF |
| Q2H | ON | OFF | OFF |
| SW1 | OFF | ON | ON |
| Q1M | OFF | ON | ON |

TABLE 1-continued

State of Amplifiers and the Switch for Each Mode

| ELEMENTS | HPM | MPM | LPM |
|---|---|---|---|
| Q2M | OFF | ON | OFF |
| Q2L | OFF | OFF | ON |

Operation of the three modes is discussed briefly here with respect to FIG. 1 (and in more detail later with respect to FIGS. 2-4).

Referring to the bottom portion of FIG. 1, in high power mode (HPM), Q1H and Q2H are "ON", whereas the switch (SW1) and all other RF stages are "OFF". A load line of approximately 4 ohms is presented to Q2H (at point H) using a standard matching network.

The group of elements to the right of point H and below Cchain1 is called an Output Matching Network (OMN). In the example of FIG. 1, the output matching network comprises three inductors and three capacitors.

Figure 3:
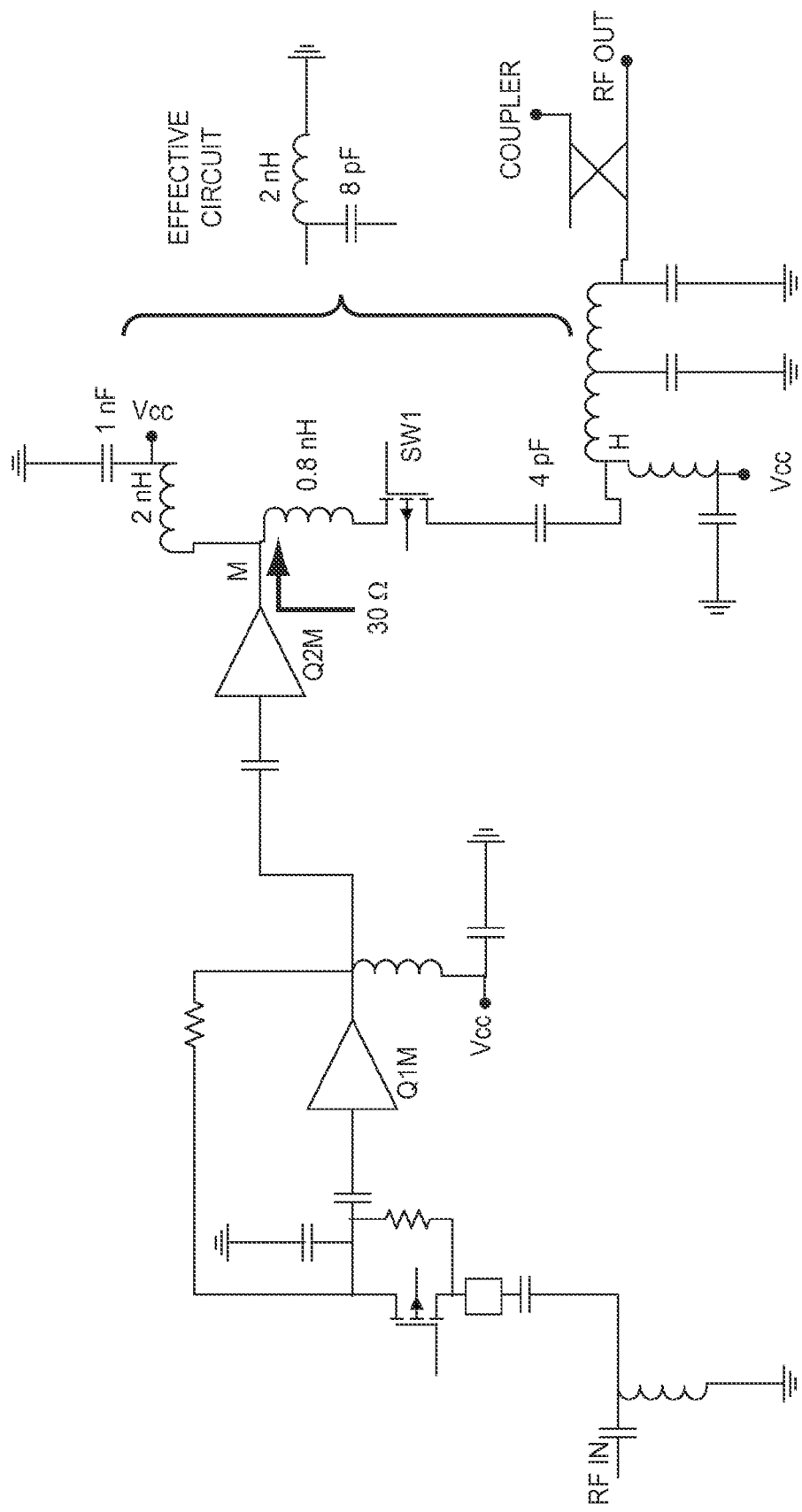
FIG. 3 illustrates a medium power mode (MPM).

Referring to the middle portion of FIG. 1, in the medium power mode (MPM), Q1M, Q2M, and SW1 are "ON", whereas Q1H, Q2H, Q2L are "OFF" (and therefore omitted from FIG. 3). In medium power mode (MPM), an impedance of about 30 ohms is presented to Q2M (at point M) by using a high pass matching network connected to the 4 ohm point (at point H) of the HPM. As shown in the MPM block at the top left of FIG. 1, the series combination of Lchain1 and Cchain1 forms an effective capacitance that is larger than Cchain1 alone. Lchain2 is the shunt L that completes the chain match which transforms the load from 4 ohms to 30 ohms.

Figure 4:
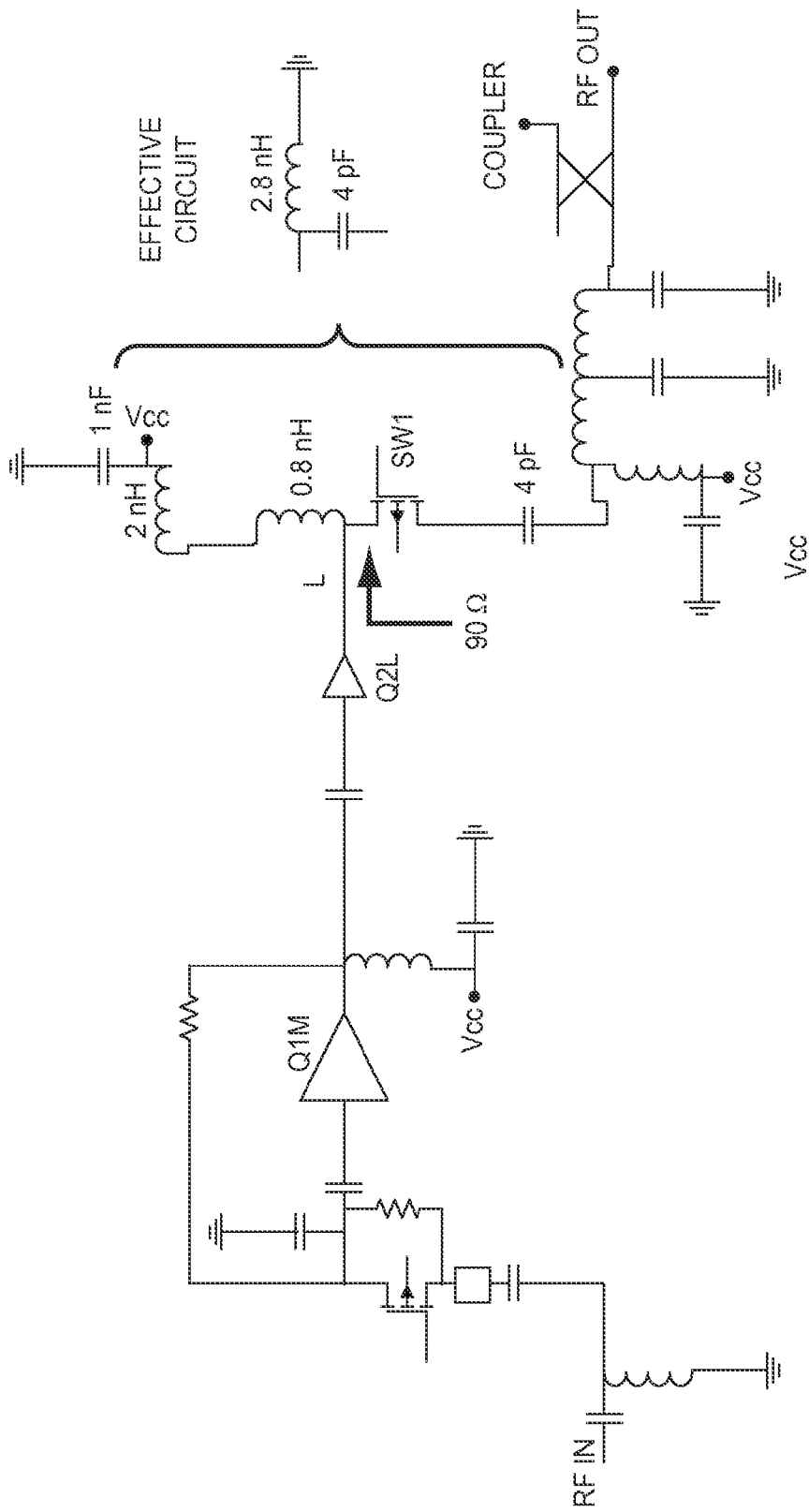
FIG. 4 illustrates a low power mode (LPM).

Referring to the top portion of FIG. 1, in the low power mode (LPM), Q1M, Q2L, and SW1 are "ON", whereas Q1H, Q2H, Q2M are "OFF" (and therefore omitted from FIG. 4). Switch SW1 in an ON state is represented by resistor Ron. The Output Matching Network (OMN) was discussed above. In low power mode (LPM) an impedance of about 90 ohms is presented to Q2L (at point L) by using a high pass matching network connected to the 4 ohm point (at point H).

As shown in the LPM block at the top right of FIG. 1, the series capacitor is just Cchain1, while Lchain1 and Lchain2 form the shunt L which transforms the load from 4 ohms to 90 ohms. These three modes are discussed in more detail in FIGS. 2-4.

From an engineering point of view, the loss in inductor Lchain1 is very important to the performance of the power amplifier. An efficient Lchain1 has a high quality factor (Q) value, and thus has low resistance and low losses.

Figure 2:
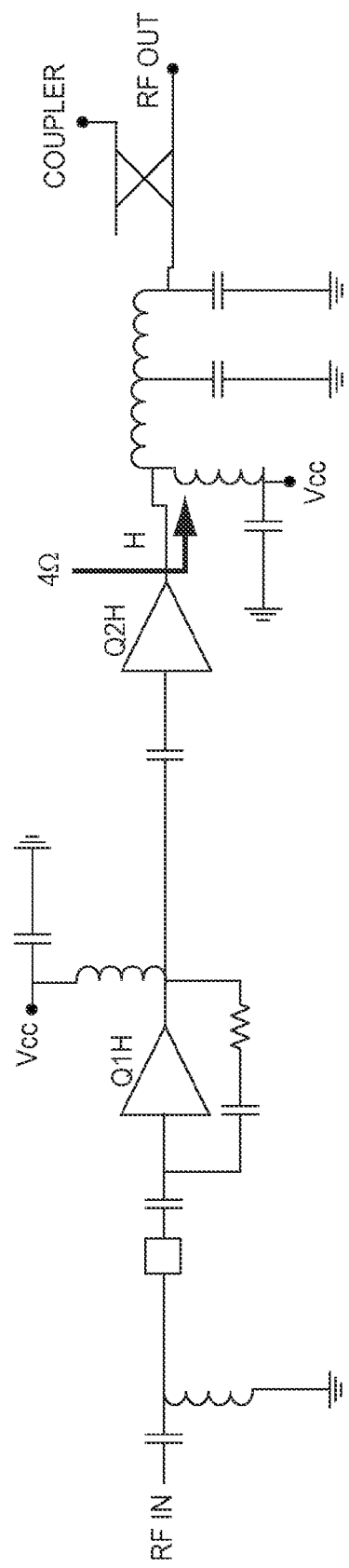
FIG. 2 illustrates a high power mode (HPM).

FIG. 2 illustrates a high power mode (HPM). FIG. 2 omits portions of the circuit of FIG. 1 which are effectively isolated by setting SW1 in the OFF state. Amplifiers Q1M, Q2M, and Q2L from FIG. 1 are preferably switched off (although this is not necessary if switch SW1 is switched off). Q1H and Q2H are ON, and form the high power path. In one embodiment, switch SW1 is omitted, and at least one amplifier in each non-utilized path is turned off. However, it is preferable to use SW1, because using SW1 improves isolation when the high power mode (HPM) is used.

In the high power mode, only the lower portion of FIG. 1 is active, and only the active portion is illustrated in FIG. 2. The output of amplifier Q2H sees an impedance of 4 ohms (at point H). The load impedance of 4 ohms at point H is necessary to provide a peak output power of 31 dBm with Vcc=3.4V.

FIG. 3 illustrates a medium power mode (MPM). FIG. 3 omits portions of FIG. 1 which are effectively isolated by turning off amplifiers QH1, QH2, and Q2L. Switch SW1 is ON. Amplifiers Q1M and Q2M form the medium power path. Amplifier Q2M sees about 30 ohms (at point M).

In medium mode, amplifier Q2M contacts the chain elements (Lchain2=2 nH, Lchain1=0.8 nH, and Cchain1=4 pF) at a location between Lchain2 and Lchain1. Note that values for these chain elements are provided here for illustrative purposes only. The values used in this application pertain to operation at 1.9 GHz.

Inductor Lchain2 has a value of 2 nH. Inductor Lchain1 has a value of 0.8 nH. Capacitor Cchain1 has a value of 4 pF. These chain elements, operating at 1.9 GHz in the medium power configuration, are equivalent to an effective RF circuit comprising an inductor 2 nH and a capacitor of 8 pF, as shown on the right side of the large brace "}" in FIG. 3.

FIG. 4 illustrates a low power mode (LPM). FIG. 4 omits portions of FIG. 1 which are effectively isolated by turning off amplifiers Q1H, Q2H, and Q2M. Amplifiers Q1M and Q2L are ON, and form the low power path. Note that in this example, amplifier Q1M is ON for the medium power mode and also for the low power mode. Amplifier Q2L sees about 90 ohms.

In low power mode, amplifier Q2L contacts the chain elements (Lchain2=2 nH, Lchain1=0.8 nH, and Cchain1=4 pF) at a location between Lchain1 and Cchain1.

Amplifiers Q1M and Q2L constitute the low power path, and are ON. Switch SW1 is ON. The other amplifiers (Q1H, Q2H, and Q2M) are OFF.

Inductor Lchain2 has a value of 2 nH. Inductor Lchain1 has a value of 0.8 nH. Capacitor Cchain1 has a value of 4 pF. These elements, operating at 1.9 GHz in the low power configuration, are equivalent to an effective RF circuit comprising an inductor 2.8 nH and a capacitor of 4 pF, as shown on the right side of the large brace "}" in FIG. 4.

Figure 5:
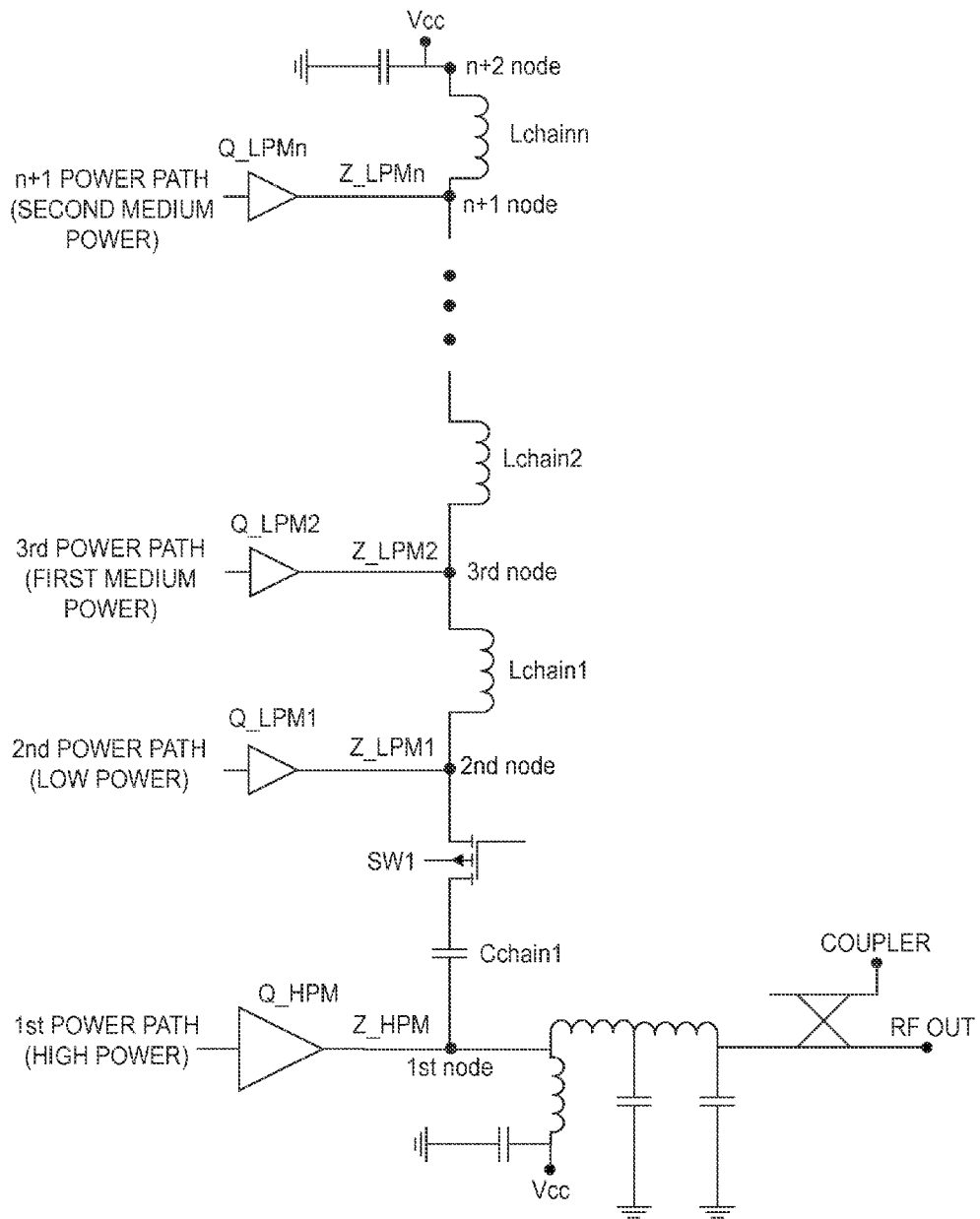
FIG. 5 illustrates a four mode power amplifier using only one switch.

FIG. 5 illustrates a four (or more) mode power amplifier using only one switch. The three mode example of FIG. 1 uses two chain matching inductors (Lchain1 and Lchain2). In FIG. 5, at least one additional inductor (Lchainn) and an associated amplifier (QLPMn) is added relative to the three mode example of FIG. 1.

The notation and design of FIG. 5 is generalized to expressly consider 4 or more modes. Additionally, much detail from FIG. 1 has been intentionally omitted (such as amplifier Q1M which was used in the low power mode and also was used in the medium power mode). Please refer to FIG. 5 and to this portion of the specification for terminology used in the claims.

In general, an n+1 mode power amplifier of four or more modes may be created using one chain matching capacitor (Cchain1), one RF switch (SW1), one high power mode amplifier (Q_HPM), n additional power mode amplifiers (Q_LPM1 through Q_LPMn), and n additional chain inductors (Lchain1 through Lchainn).

FIRST POWER PATH: The first power path is located at the bottom of FIG. 5. The first power path includes amplifier Q_HPM, as well as any amplifiers preceding amplifier Q_HPM (outputting towards Q_HPM). The first power path is associated with a high power mode (actually the highest power mode).

The high (highest) power mode occurs when amplifier Q_HPM is ON (and, of course any other amplifiers in the path of Q_HPM are ON), SW1 is OFF, and the other amplifiers in other paths are preferably all OFF, with the exception that any amplifier which shares the first power path must remain ON. This high power mode corresponds to a low impedance of Z_HPM at the first node.

SECOND POWER PATH: In the second power path, a low (lowest) power mode occurs when amplifier Q_LPM1 is ON (and any other amplifiers in the path of Q_LPM1 are ON), SW1 is ON, and at least one amplifier in each of the other paths is OFF (preferably all amplifiers in the other paths are OFF, except for amplifiers shared by the path including Q_LPM1).

Of course, as illustrated by the above three mode example, any amplifier which is shared by two or more paths must be ON when one of the paths which shares the shared amplifier is active (see Q1M in FIG. 1). Similarly, each path preferably contains at least one amplifier that is not shared. This low power mode corresponds to a high impedance at Z_LPM1. In other words, Z_HPM< . . . <Z_LPM1.

For the purpose of clarity and simplicity, we consider the case where there are four modes (n=3) so that no additional chain inductors and no additional power paths are needed relative to FIG. 5. A first power path passes through amplifier Q_HPM, a second power path passes through Q_LPM1, a third power path passes through Q_LPM2, and an (n+1)th (fourth in this case) power path passes through Q_LPMn.

With respect to impedance: Z_HPM<Z_LPMn<Z_LPM2<Z_LPM1.

The order with respect to power is reversed relative to the order of impedance, as follows: first power path>nth power path>third power path>second power path.

THIRD POWER PATH Continuing, the first medium power (second lowest) output mode occurs when amplifier Q_LPM2 is ON, and corresponds to an impedance of Z_LPM2. The claims refer to this output mode as "first medium power mode" for the case when there are four modes. This first medium power mode has more power than the low power mode, but less than the high power mode. This first medium power mode corresponds roughly to the medium power mode of the circuit of FIG. 1 and FIG. 3.

(N+1)TH POWER PATH. The (n+1)th (fourth power path) is described as a second (or nth) medium power mode. This second medium power mode has more power than the first medium power mode, but less than the high power mode. This second medium power mode corresponds roughly to extending the circuit of FIG. 1 upwards by adding an additional power path (including at least one additional amplifier) above amplifier Q2M, plus inserting an additional chain inductor above Lchain2 and below Vcc. The additional amplifier would be connected above Lchain2 and below the additional chain inductor.

To summarize more generally, for a four or more mode power amplifier the load impedances are ordered as follows: Z_HPM<Z_LPMn< . . . <Z_LPM2<Z_LPM1. The order with respect to power is reversed relative to the order with respect to impedance.

Figure 6:
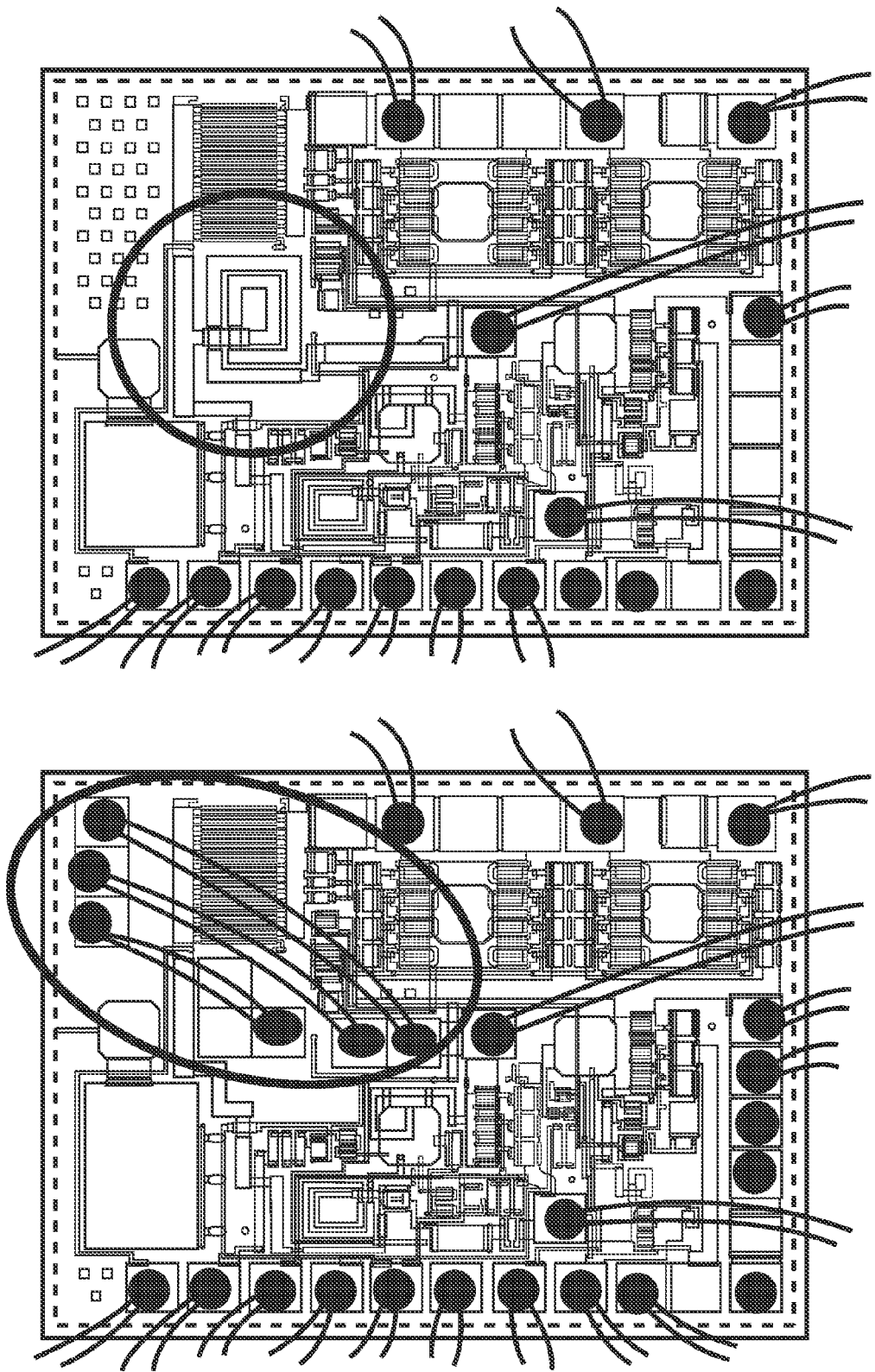
FIG. 6 illustrates different ways to implement MDLS inductor Lchain1.

FIG. 6 illustrates different ways to implement the MDLS inductor Lchain1. Specifically, the large bold circle at the top circuit of FIG. 6 surrounds a printed spiral inductor, and the large bold ellipse at the bottom circuit of FIG. 6 surrounds an inductor using three bond wires.

The bond wires have some inductance at typical RF frequencies. The use of bond wires increases the quality factor (Q) of the MDLS inductor, which improves the LPM and MPM efficiency due to reduced output matching network losses.

Figure 7:
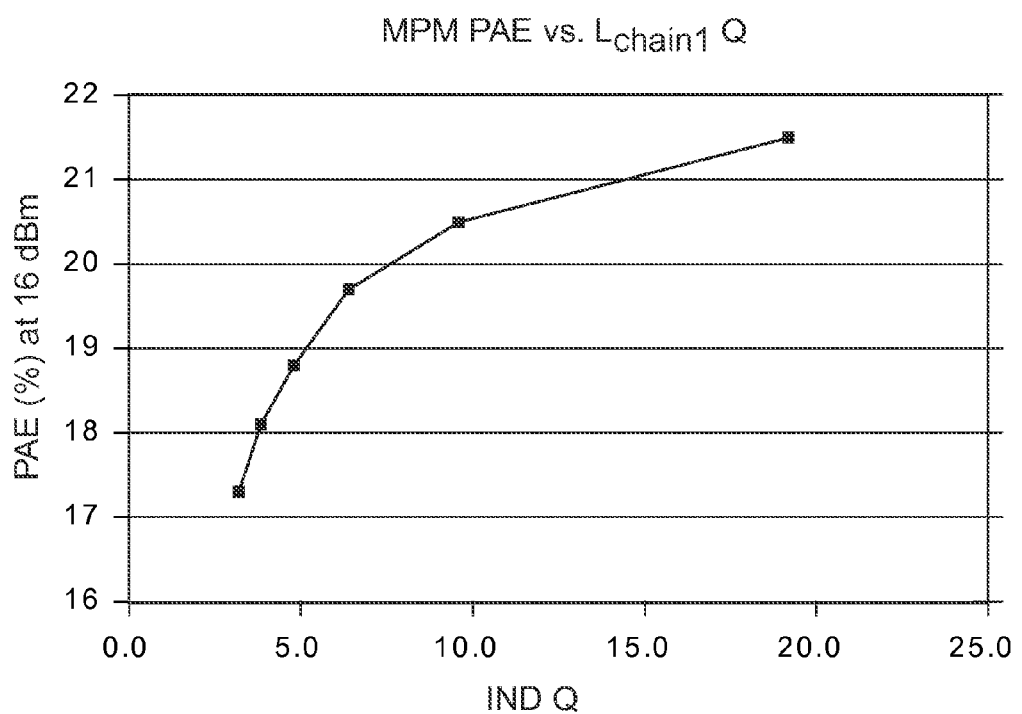
FIG. 7 illustrates the importance of the MDLS inductor Q on MPM efficiency.

FIG. 7 illustrates the importance of the MDLS inductor Q on MPM efficiency. Specifically, Medium Power Mode (MPM) Power Added Efficiency (PAE) is graphed versus IND Q (the quality factor of the chain inductor Lchain1). Typical printed spirals on GaAs (Gallium Arsenide) can have a Q as low as 5 while bond wires have Q well in excess of 25. As the Q value falls below 10, efficiency drops off dramatically. Thus, bond wires are strongly preferred, especially gold bond wires.

Figure 8:
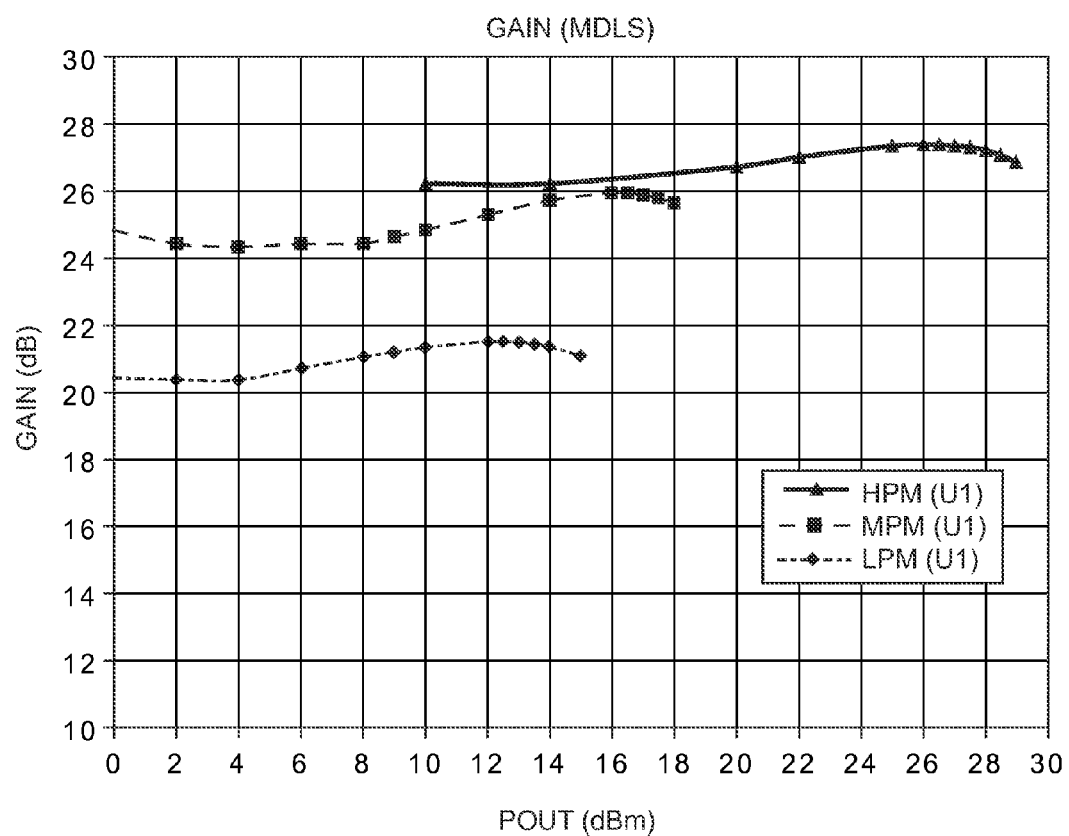
FIG. 8 illustrates gain of the three modes of the MDLS Power Amplifier.

FIG. 8 illustrates gain of the three modes of an MDLS Power Amplifier using bond wires for the inductor. The frequency is 1.88 GHz, Vcc is 3.4 V, and the measurements were made using IS95 CDMA modulation.

Figure 9:
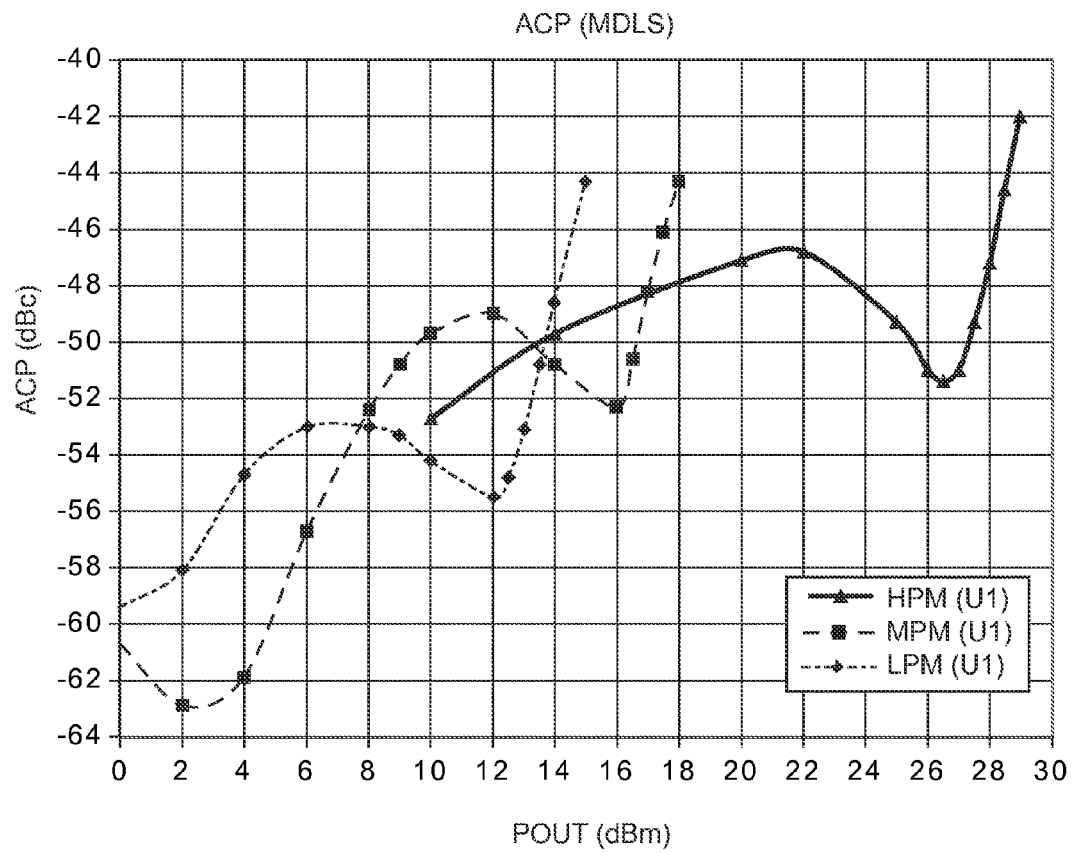
FIG. 9 illustrates the adjacent channel power (ACP).

FIG. 9 illustrates the adjacent channel power (ACP). Some systems require −42 dBc or less, and with a target of −48 dBc or less.

Figure 10:
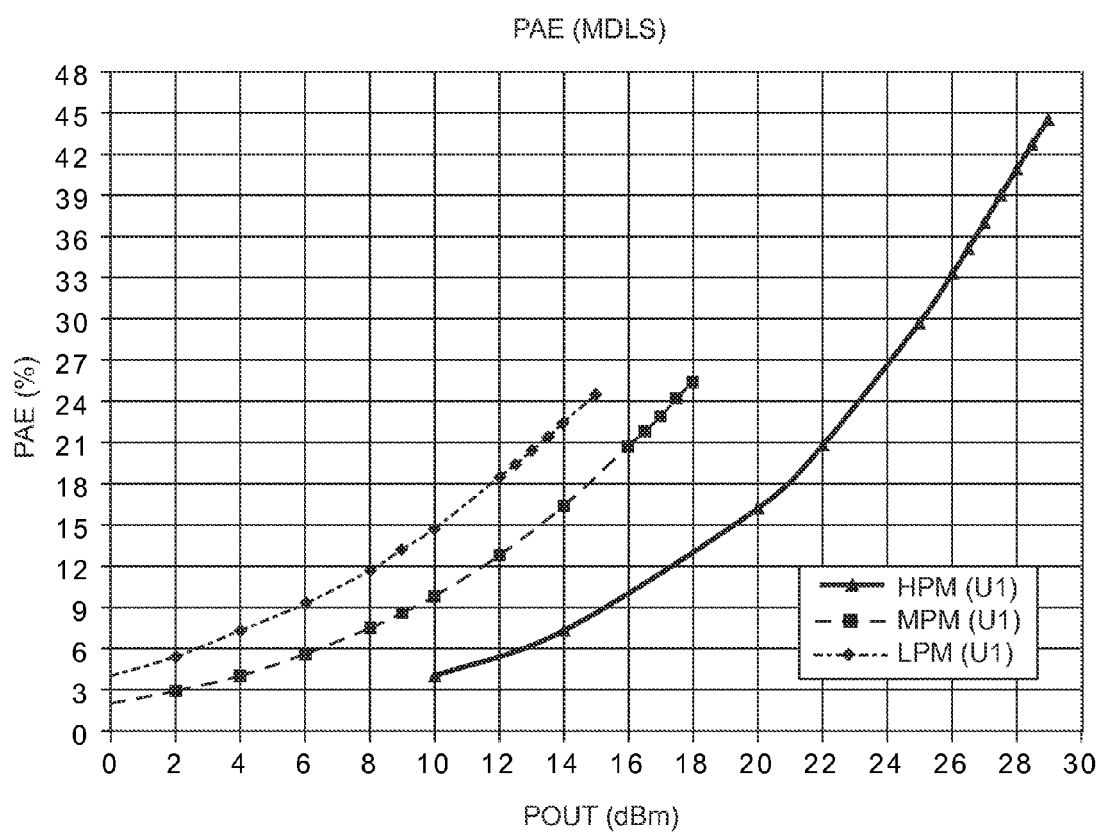
FIG. 10 illustrates the Power Added Efficiency (PAE) versus power out (Pout) for all three modes.

FIG. 10 illustrates the Power Added Efficiency (PAE) versus power out (Pout) for all three modes.

Figure 11:
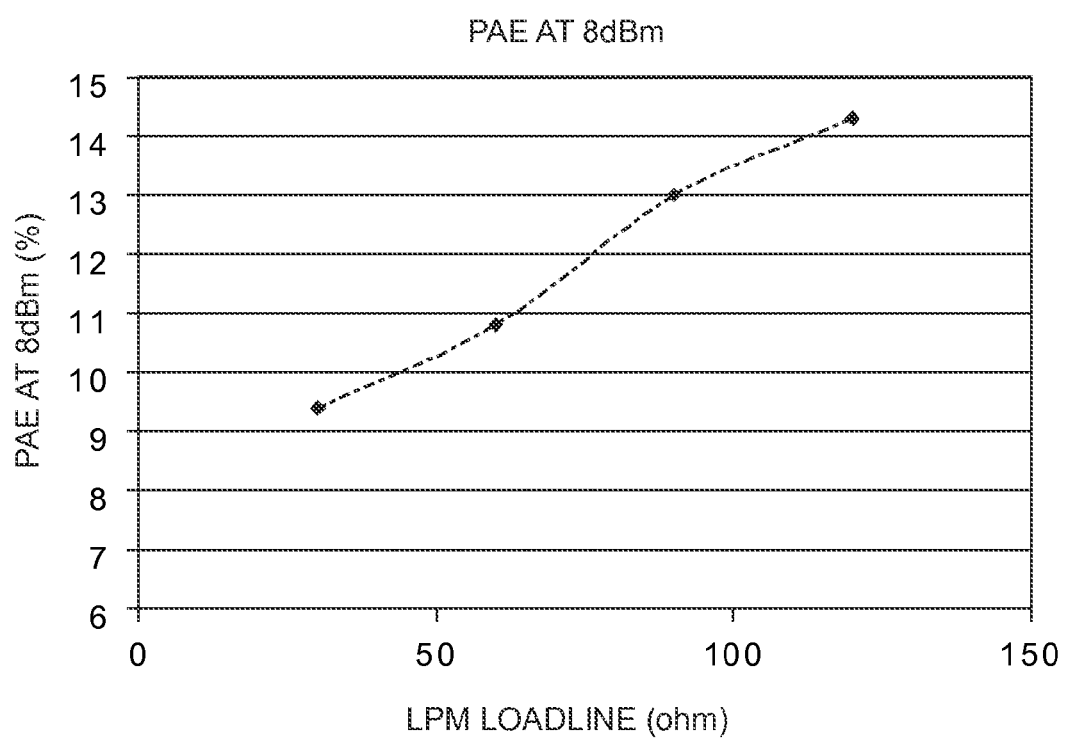
FIG. 11 illustrates Power Added Efficiency (PAE) versus LPM loadline.

FIG. 11 illustrates Power Added Efficiency (PAE) versus LPM loadline at 8 dBm. The LPM load line has a significant impact on LPM efficiency, back off linearity, and minimum Icq. The MDLS architecture allows one to easily increase the LPM loadline above that of the MPM. FIG. 11 shows the increase in LPM efficiency as the LPM load line increases from 30 ohms (the MPM load line) to 120 ohms. With a 90 ohm load line, the efficiency at 8 dBm increases from about 9.5% to 13%.

Figure 12:
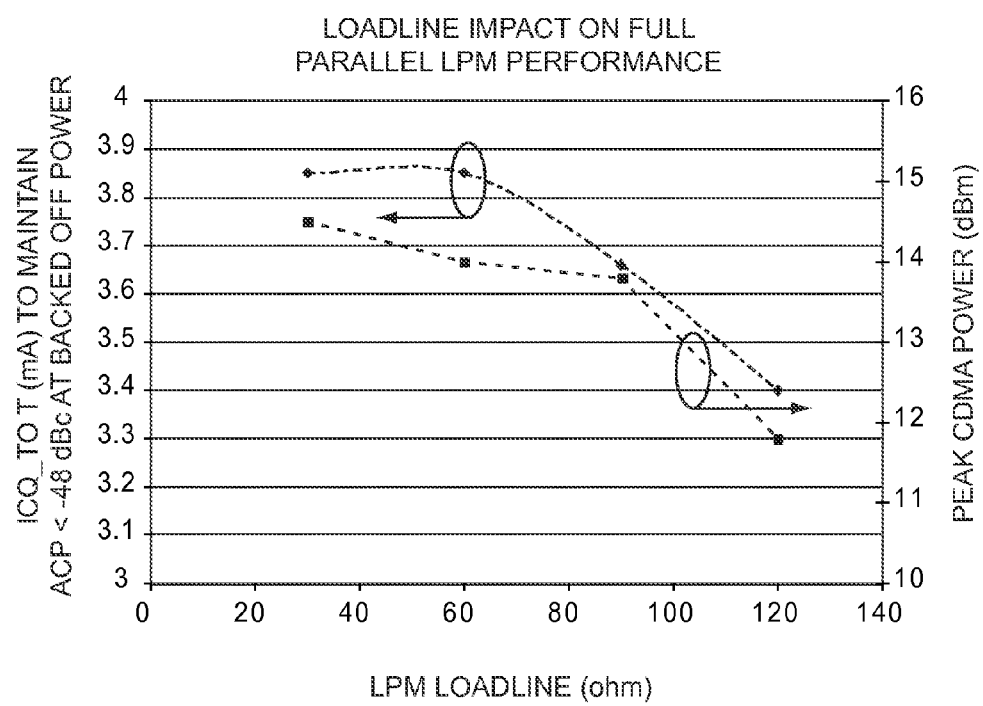
FIG. 12 illustrates maximum linear output power and minimum necessary Icq.

FIG. 12 illustrates maximum linear output power and minimum necessary Icq (quiescent collector current, with no RF input) to maintain adjacent power channel ratio (ACP) less than −48 dBc at backed off power. A second advantage of the increased LPM load line is that as the Icq of the LPM is decreased, the linearity at back off power degrades less.

Specifically, FIG. 12 shows the minimum IN required for a 2 stage LPM to achieve −48 dBc ACPR (IS95). As the LPM load line increased, the maximum linear output power goes down, but the minimum required IN for −48 dBc linearity also goes down. If only 12 dBm maximum output power is required in the LPM, a 120 ohm load line will allow one to achieve that output power with about 15% less quiescent current than a 30 ohm load line. Alternatively, if one keeps Icq constant, increasing the LPM load line increases PAE and improves back-off linearity.

An additional benefit of the MDLS architecture is the ability to control insertion phase changes between modes. The addition of Lchain1 increases the degrees of freedom to reduce the insertion phase change between modes. The example PCS amplifier shown in FIGS. 8-10 has a maximum phase delta of less than 25 degrees.

Table 2 illustrates average current for various power amplifiers. Specifically, Table 2 compares the average current computed using different statistics for both the bond wire and the printed spiral (MMIC) implementation of the MDLS inductor. Data for a competitor's part is also included in the table. The higher Q of the bond wire implementation reduced the "urban" average current by about 0.5 mA.

TABLE 2

Average Current Comparison

| | MDLS (MMIC Inductor) (3 modes) | MDLS (BW Inductor) (3 modes) | Competitor C Amplifier |
|---|---|---|---|
| Urban environ. | 20.1 mA | 19.6 mA | 21.8 mA |
| Suburban environ. | 42.2 mA | 41.5 mA | 46.4 mA |

The first column is MDLS using a spiral inductor (MMIC Ind), the second column is MDLS using a bonded wire inductor (BW Ind), and the third column is a conventional power amplifier.

The first row is values for average current using standards for simulating an urban environment. The second row is values for simulating a suburban environment. The lowest average current of 19.6 mA is for a bonded wire MDLS power amplifier in an urban environment.

Figure 13:
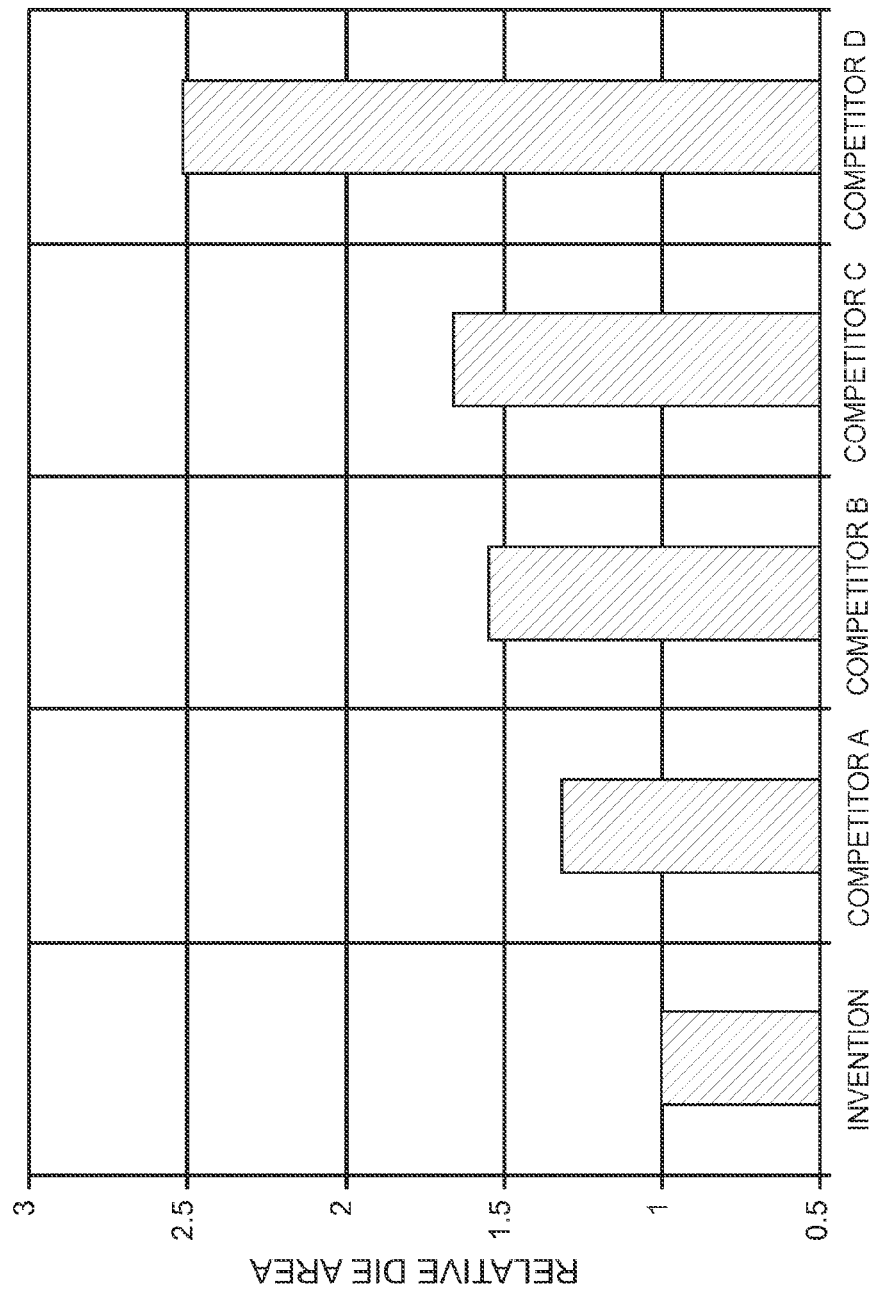
FIG. 13 illustrates the relative die area of this invention in comparison to conventional competitors.

FIG. 13 illustrates the relative die area of this invention in comparison to conventional competitors.

Those skilled in the art will recognize improvements and modifications to the embodiments of the present disclosure. All such improvements and modifications are considered within the scope of the concepts disclosed herein and the claims that follow.

What is claimed is:

1. A circuit having at least three power modes of operation, the circuit comprising:
   a first power path including a first amplifier, wherein an output of the first amplifier is connected to a first node, and wherein the first power path is a high power path;
   a first chain capacitor and a first switch connected in a first series, wherein a first end of the first series is connected to the first node, and wherein a second end of the first series is connected to a second node;
   a second power path including a second amplifier, wherein an output of the second amplifier is connected to the second node, and wherein the second power path is a low power path;
   a first chain inductor connecting from the second node to a third node;
   a third power path including a third amplifier, wherein an output of the third amplifier is connected to the third node, and wherein the third power path is a first medium power path; and
   a second chain inductor connecting from the third node to a fourth node, and
   wherein the high power path is associated with a high power, the low power path is associated with a low power, and the first medium power path is associated with a first medium power, and
   wherein the high power is greater than first medium power, and wherein the first medium power is greater than the low power.

2. The circuit of claim 1, further comprising:
   a fourth power path connected to the fourth node, such that the fourth power path is connected to the third power path through the second chain inductor, and
   wherein the fourth power path is associated with a second medium power, and
   wherein the second medium power is greater than the first medium power and is less than the high power.

3. The circuit of claim 1, further comprising:
   a power supply voltage node connected to the fourth node, such that power supply voltage passes through the second chain inductor towards the third node.

4. A circuit having at least three power modes of operation, the circuit comprising:
   a first power path including a first amplifier, wherein an output of the first amplifier is connected to a first node, and wherein the first power path is a high power path;
   a first chain capacitor and a first switch connected in a first series, wherein a first end of the first series is connected to the first node, and wherein a second end of the first series is connected to a second node;
   a second power path including a second amplifier, wherein an output of the second amplifier is connected to the second node, and wherein the second power path is a low power path;
   a first chain inductor connecting from the second node to a third node;
   a third power path including a third amplifier, wherein an output of the third amplifier is connected to the third node, and wherein the third power path is a first medium power path; and
   a second chain inductor connecting from the third node to a fourth node, and
   wherein the high power path is associated with a high power, the low power path is associated with a low power, and the first medium power path is associated with a first medium power,
   wherein the high power is greater than first medium power, and wherein the first medium power is greater than the low power, and
   wherein no additional switch is present between the output of the first amplifier and the first node, no additional switch is present between the output of the second amplifier and the first node, and no additional switch is present between the output of the third amplifier and the first node.

5. The circuit of claim 4, wherein no additional switch is present in the first power path, no additional switch is present in the second power path, and no additional switch is present in the third power path.

6. The circuit of claim 5, wherein the fourth node is connected to a power supply.

7. The circuit of claim 5, wherein the first node is connected to an RF (Radio Frequency) output via an output portion, wherein the output portion includes an Output Matching Network (OMN).

8. The circuit of claim 5, wherein the at least three power modes comprise: a high power mode associated with the first power path and configured to generate the high power, a low power mode associated with the second power path and configured to generate the low power, and a first medium power mode associated with the third power path and configured to generate the first medium power.

9. The circuit of claim 8, wherein the high power mode is configured to turn ON all amplifiers in the first power path, and the first switch is OFF.

10. The circuit of claim 9, wherein the high power mode is further configured to turn OFF all amplifiers in other power paths which are not shared by the first power path.

11. The circuit of claim 8, wherein the low power mode is configured to turn ON all amplifiers in the second power path, and the switch is ON.

12. The circuit of claim 11, wherein the low power mode is further configured to turn OFF all amplifiers in other power paths which are not shared by the second power path.

13. The circuit of claim 8, wherein the first medium power mode is configured to turn ON all amplifiers in the first medium power path, and the first switch is ON.

14. The circuit of claim 13, wherein the first medium power mode is further configured to turn OFF all amplifiers in other power paths which are not shared by the first medium power path.

15. The circuit of claim 8, wherein each power path includes at least one amplifier which is not shared by any other power path.

16. The circuit of claim 8, wherein the high power mode is configured to present a low output impedance to the first power path, the low power mode is configured to present a high output impedance to the second power path, and the first medium power mode is configured to present a first medium power output impedance to the third power path.

17. The circuit of claim 8, wherein an output portion comprises any realizable impedance matching network.

18. The circuit of claim 8, wherein the circuit further has a fourth mode of operation, the circuit further comprising:
- a fourth power path including a fourth amplifier, wherein the output of the fourth amplifier is connected to the fourth node; and
- a third chain inductor connecting the fourth node to a fifth node,
- wherein there is no additional switch in the fourth power path,
- wherein the fourth power path is a second medium power path,
- wherein a power of the second medium power path is greater than the power of the first medium power path, and is less than the power of the high power path, and
- wherein the at least three modes further includes a second medium power mode associated with the second medium power path.

19. The circuit of claim 18, wherein the circuit further has a fifth mode of operation, the circuit further comprising:
- a fifth power path including a fifth amplifier, wherein the output of the fifth amplifier is connected to the fifth node; and
- a fourth chain inductor connecting the fifth node to a sixth node,
- wherein there is no additional switch in the fifth power path, and
- wherein the fifth power path is a third medium power path,
- wherein the power of the third medium power path is greater than the power of the second medium power path, and is less than the power of the high power path, and
- wherein the at least three modes further includes a third medium power mode associated with the third medium power path.

20. A circuit having at least three power modes of operation, the circuit comprising:
- a first power path including a first amplifier, wherein an output of the first amplifier is connected to a first node, and wherein the first power path is a high power path;
- a first chain capacitor connecting the first node to a second node; and
- a second power path including a second amplifier, wherein an output of the second amplifier is connected to the second node, and wherein the second power path is a low power path;
- a first chain inductor connecting from the second node to a third node;
- a third power path including a third amplifier, wherein an output of the third amplifier is connected to the third node, and wherein the third power path is a first medium power path; and
- a second chain inductor connecting from the third node to a fourth node, and
- wherein the high power path is associated with a high power, the low power path is associated with a low power, and the first medium power path is associated with a first medium power, and
- wherein the high power is greater than first medium power, and wherein the first medium power is greater than the low power.

21. A circuit having at least three power modes of operation, the circuit comprising:
- a first power path including a first amplifier, wherein an output of the first amplifier is connected to a first node, and wherein the first power path is a high power path;
- a first chain capacitor connecting the first node to a second node; and
- a second power path including a second amplifier, wherein an output of the second amplifier is connected to the second node, and wherein the second power path is a low power path;
- a first chain inductor connecting from the second node to a third node;
- a third power path including a third amplifier, wherein an output of the third amplifier is connected to the third node, and wherein the third power path is a first medium power path; and
- a second chain inductor connecting from the third node to a fourth node, and
- wherein the high power path is associated with a high power, the low power path is associated with a low power, and the first medium power path is associated with a first medium power,
- wherein the high power is greater than first medium power, and wherein the first medium power is greater than the low power, and
- wherein no switch is present between the output of the first amplifier and the first node, no switch is present between the output of the second amplifier and the first node, and no switch is present between the output of the third amplifier and the first node.

22. A circuit having at least three power modes of operation, the circuit comprising:
- a first power path including a first amplifier, wherein an output of the first amplifier is connected to a first node, and wherein the first power path is a high power path;
- a first chain capacitor and a first switch connected in a first series, wherein a first end of the first series is connected to the first node, and wherein a second end of the first series is connected to a second node;
- a second power path including a second amplifier, wherein an output of the second amplifier is connected to the second node, and wherein the second power path is a low power path;
- a third power path including a third amplifier, wherein an output of the third amplifier is connected to a third node, and wherein the third power path is a first medium power path, and
- wherein no additional switch is present between the output of the third amplifier and the first node.

23. The circuit of claim 22, further comprising:
- a second chain inductor connecting from the third node to a fourth node, and
- wherein the high power path is associated with a high power, the low power path is associated with a low power, and the first medium power path is associated with a first medium power, and
- wherein the high power is greater than first medium power, and wherein the first medium power is greater than the low power.

* * * * *